(12) United States Patent
Umbach

(10) Patent No.: US 7,728,624 B2
(45) Date of Patent: Jun. 1, 2010

(54) CIRCUIT ARCHITECTURE FOR AN INTEGRATED CIRCUIT

(75) Inventor: Gert Umbach, Gundelfingen (DE)

(73) Assignee: Micronas GmbH, Freiburg (DE)

( * ) Notice: Subject to any disclaimer, the term of this patent is extended or adjusted under 35 U.S.C. 154(b) by 0 days.

(21) Appl. No.: 11/546,011

(22) Filed: Oct. 10, 2006

(65) Prior Publication Data

US 2007/0080713 A1   Apr. 12, 2007

(30) Foreign Application Priority Data

Oct. 7, 2005   (DE)   .................. 10 2005 048 525

(51) Int. Cl.
*H03K 19/094*   (2006.01)
*G06F 7/38*   (2006.01)
*H03K 19/173*   (2006.01)
*H01L 25/00*   (2006.01)
*H03K 19/00*   (2006.01)
*G06F 7/44*   (2006.01)

(52) U.S. Cl. .................. 326/41; 326/37; 326/38; 326/39; 326/40; 326/47; 326/93; 708/523; 708/551; 708/490; 708/501; 708/503

(58) Field of Classification Search .................. None
See application file for complete search history.

(56) References Cited

U.S. PATENT DOCUMENTS

| | | | | |
|---|---|---|---|---|
| 4,758,985 A | * | 7/1988 | Carter | ................. 365/94 |
| 5,355,508 A | | 10/1994 | Kan | .................. 395/800 |
| 6,118,298 A | * | 9/2000 | Bauer et al. | .................. 326/39 |
| 6,496,916 B1 | * | 12/2002 | Fadavi-Ardekani et al. | . 711/173 |
| 2004/0158598 A1 | * | 8/2004 | Hong et al. | ............... 708/492 |
| 2004/0178818 A1 | * | 9/2004 | Crotty et al. | ................ 326/40 |
| 2005/0038844 A1 | * | 2/2005 | Langhammer et al. | ...... 708/620 |

FOREIGN PATENT DOCUMENTS

WO   WO 03/105345   12/2003

* cited by examiner

*Primary Examiner*—Vibol Tan
*Assistant Examiner*—Matthew C Tabler
(74) *Attorney, Agent, or Firm*—O'Shea Getz P.C.

(57) ABSTRACT

An integrated circuit comprising at least one group comprising having multiple arithmetic/logic units arranged in sub-groups. In the sub-groups at inputs of multiple arithmetic/logic units, in each case a single one of the first selection units is connected on the input side, wherein no other selection unit is connected directly on the input side of this selection unit. The first selection units are coupled to each other such that a horizontal and/or vertical logical interconnection of the arithmetic/logic units within a group, and/or a logical interconnection of arithmetic/logic units to an upstream group can be implemented. Second selection units are in each case connected on the output side of a column of arithmetic/logic units. The second selection units of a group are connected on the output side to one bus each, and a microprocessor is coupled to this bus.

11 Claims, 3 Drawing Sheets

CIRCUIT ARCHITECTURE FOR AN INTEGRATED CIRCUIT

PRIORITY INFORMATION

This patent application claims priority from German patent application 10 2005 048 525.1 filed Oct. 7, 2005, which is hereby incorporated by reference.

BACKGROUND INFORMATION

The invention relates to a circuit architecture for an integrated circuit, and in particular to an arrangement of arithmetic/logic units, selection units, and control units in such an architecture.

As the use of integrated circuits has been growing for years in all areas of electronics, tremendous efforts have been made by manufacturers to achieve efficient realizations of integrated circuits in the shortest possible time. The electronics industry has been continually driven by the need to increase performance and reduce costs, while improving the features of the integrated circuits. Additional requirements include the need to optimize the circuit architectures offered—implemented, for example, as integrated circuits—in terms of surface area requirement, power consumption, and power loss.

Many of the requirements are met through the use of newer, faster, and cheaper technologies. These new technologies enable a larger number of functions and features to be combined on a single piece of silicon. Functions previously located on separate chips can now be offered in a single system integrated within a single chip. Due to the complexity and high degree of specialization within the various areas of application for integrated circuits, increasing use is being made of application-specific integrated circuits. Application-specific integrated circuits can then be subdivided into user-programmable components and components fabricated for specific applications, where the latter, although highly specialized, are nevertheless fabricated to execute fixed specified functions and are not configurable by the user.

In many areas, however, there exists precisely the need to supply integrated circuits, the architecture of which provides the user with the flexibility of reacting quickly to new requirements. These integrated circuits, also identified as user-programmable components, involve universal elements, the fabrication of which is implemented by the manufacturer on a standardized basis, but which are defined in terms of their ultimate function only by a programming or configuration performed by the user. See reference: G. Umbach, 1966, Kaiserslautern, dissertation, "*Optimization of Macrocell-Based Sea-of-Gates Architecture for Communications Technology.*"

One representative example of a field of application for these components configurable by the user is the automotive industry which demands even shorter product development cycles. For example, even today there are more than seventy control systems in use in a luxury-class automobile. As a result, the share of electronics and software has risen to over 30% within the value-added chain. However, design tasks have also become even more demanding as a result of the increasing complexity and number of functions to be performed by an electronic system. Then there is the additional demand for a short time span between the start of development and market maturity (time-to-market) which must succeed without costly supplemental corrections to the final product within its application environment. This results in corresponding requirements in terms of high flexibility and simultaneous inexpensive fabrication of these components.

Examples of control systems using these types of components in automotive engineering include control devices for the engine, transmission, ESP, air suspension, automatic climate control, sound system, parking aids, instrument clusters, and data buses.

The integrated circuits fabricated for specific applications can be further subdivided into designs completely configurable by the user and designs partially configurable by the user. In the case of designs completely configurable by the user, all the design steps are accordingly parametrized and optimized, and there are no restrictions on the design or on the configuration of the subsequent interconnection circuitry based on individual customer requirements. In the case of these designs which are partially configurable by the user, as are those covered by this patent, the user exploits prefabricated and pre-wired basic structures which can then be further interconnected in a configurable manner by the user according to his requirements. It is obvious that these designs, which are partially configurable by the user, have advantages in terms of their surface area requirement on a chip, power consumption, and production costs relative to designs that are completely and freely configurable for which implementation as an integrated circuit is significantly more complex and thus, among other things, more cost-intensive.

One example of integrated circuits with prefabricated basic structures involves hardwired hardware solutions in which the configurability is restricted to parametrization by registers. Additional examples include Field Programmable Gate Arrays (FPGAs) and Application-Specific ICs (ASICs) which have, in part, basic structures in macrocells to increase efficiency in terms of the required silicon surface of the chip, power consumption, and cost. Another example that could be mentioned for the use of prefabricated basic structures involves so-called streaming units which, however, in many cases do not have the requisite flexibility.

One disadvantage of the listed examples of prior art integrated circuits having prefabricated basic structures according to the prior art is that, while these largely fulfill the requirements in terms of small surface area on the chip, low power consumption, and low cost, from the perspective of most current requirements, they do not adequately meet the ever-increasing demands for flexibility in terms of the configurability of these inexpensive integrated circuits.

Therefore, there is a need for an arrangement of arithmetic/logic units, selection units, and control units in a circuit architecture which, while retaining the advantages of small surface requirement on a chip, low power consumption, and low cost, has an increased degree of flexibility of configurability relative to the prior art.

SUMMARY OF THE INVENTION

This goal is achieved by a configurability of the interconnection circuitries of arithmetic/logic units and control units relative to each other, which configurability is in each case adapted to a specific group of selected functions and/or algorithms.

The circuit architecture of the present invention may be used in the management of internal combustion engines or suspension control, video and/or audio applications, graphics applications, and scientific computing. These applications are enumerated only by way of example. The invention is not restricted to these.

Advantageously, a circuit of the present invention provides increased flexibility of the configurability along with the simultaneous retention of efficiency in terms of surface area requirement, power consumption, and production cost.

Additional advantages also result if the increased flexibility of the arrangement relates not only to the selection of the algorithm to be implemented in the integrated circuit but also enables the simultaneous implementation of multiple and in each case different algorithms despite the essentially-effected predefinition of the arrangement of, and connections between, arithmetic/logic units and control units, which predefinition is necessary for the desired efficiency.

Additional advantages can result if the magnitude of the extent of the configurable interconnection of arithmetic/logic units and control units is individually configurable for each of the multiple different algorithms implemented, such that for each of the different algorithms—implemented, for example, simultaneously within the same arrangement—the optimum computing capacity can be provided for a given function through almost any desired individual interconnection of arithmetic/logic units, wherein the configuration of the interconnection circuitry can also be effected, in one embodiment of the invention, during the run time of the algorithm, and can therefore be adapted dynamically to the different functions.

Similarly, still more advantages can also result if the arithmetic/logic units of the circuit are implemented differently—for example, as multiply/accumulate units, and/or dividers, and if parts of the circuit architecture such as, for example, microprocessors and control units, are optionally co-integrated into the circuit architecture or are implemented as external arrangements.

These and other objects, features and advantages of the present invention will become more apparent in light of the following detailed description of preferred embodiments thereof, as illustrated in the accompanying drawings.

DETAILED DESCRIPTION OF THE INVENTION

Figure 1:
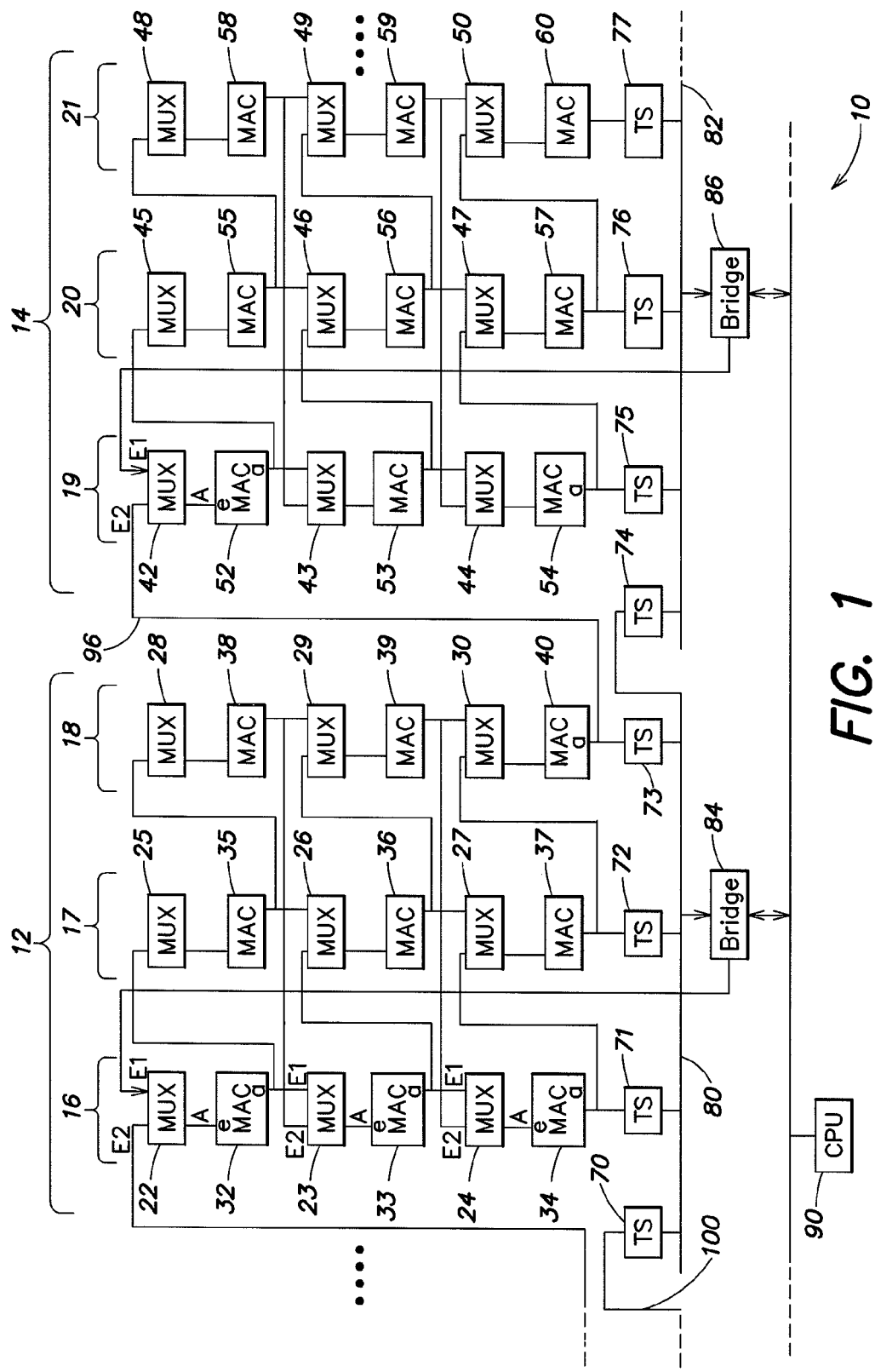
FIG. 1 is a block diagram illustration of an arrangement of arithmetic/logic units and selection units.

FIG. 1 is a block diagram illustration of a circuit 10 comprising a plurality of arithmetic/logic units and selection units. The circuit 10 is configured and arranged to include a plurality of groups 12, 14, and a plurality of sub-groups 16-21 arranged for the purposes of illustration as columns. Each of the sub-groups includes a plurality of first selection units (e.g., multiplexers) and a plurality of arithmetic/logic units. For example, the first group 12 includes first selection units 22-30 and arithmetic logic units 32-40, while the second group 14 includes first selection units 42-50 and arithmetic logic units 52-60. The first selection units and the arithmetic/logic units are arranged alternately within each sub-group, as a result of which one pair each is formed, composed of a first selection unit and an arithmetic/logic unit. Each sub-group preferably contains an equal number of selection units and arithmetic/logic units.

The arithmetic/logic units comprise an input e and an output a. Separate coefficient inputs are not shown here in the interest of ease of illustration. The first selection units 22-30, 42-50 are preferably implemented as multiplexers having at least two inputs each. At least some of the arithmetic/logic units are implemented as multiply/accumulate units, and at least some others of the arithmetic/logic units are implemented as dividers.

FIG. 1 comprises a plurality of second selection units 70-77, a plurality of buses 80, 82, a plurality of preferably bidirectionally designed switching devices 84, 86, and a microprocessor 90. The microprocessor 90 may be implemented as a CPU, a digital signal processor, or a state machine, depending on the various embodiments and functions.

The microprocessor 90 is connected to each of the plurality of bidirectional switching devices 84,86, such that the processor 90 can receive signals from and provide signals to the switching devices 84,86. In each case, one switching device is associated with each of the plurality of groups. The switching device 84 provides a signal from the microprocessor 90 to the selection unit 22, while the switching device provides a signal from the microprocessor 90 to the selection unit 42.

Referring still to FIG. 1, the second input E2 of the first of the first selection units in a group receives its signal from the last one of the plurality of arithmetic/logic units in the preceding upstream group. For example, the selection unit 42 receives a signal on a line 96 from the arithmetic/logic unit 40. Additionally in FIG. 1, in each of the plurality of sub-groups the respective outputs of each of the first selection units is connected to the respective input e of the downstream arithmetic/logic unit. This connection of the output of the first selection units to the input e of the respective downstream arithmetic/logic units in the same sub-group continues as shown in FIG. 1 within each sub-group until the last pair within a sub-group is reached.

The output a of the arithmetic/logic units within a sub-group is in turn connected to the input E1 of the first selection unit located downstream in the same sub-group. This connection of output a of the arithmetic/logic units to input E1 of the respective downstream first selection unit in the same sub-group accordingly continues as shown in FIG. 1 until the last pair of first selection unit and an arithmetic/logic unit is reached within the sub-group. The output of the arithmetic/logic unit of the respective last pair of each given sub-group is provided to an associated one of the downstream second selection units 70-77.

The second selection units 70-73 provide output signals onto the first bus 80, while the second selection units 74-77 of the second group 14 provide output signals to the second bus 82. The second selection units 70-77 may include tri-state outputs (e.g., tri-state buffers). The first bus 80 provides an input signal to the second selection unit 74, and the second selection unit 70 receives its input signal from bus 100. As a result, a logical interconnection of arithmetic/logic units of a group is established with an upstream group. In the interest of ease of illustration, the drawings do not illustrate the enable signals for the tristate buffers, since control of such devices is known. The first bus 80 provides an input signal to the switching device 84, while the second bus 82 provides an input signal to the switching device 86. As a result the signals on the first and second buses 80, 82 respectively can be supplied to the microprocessor 90 through the switching devices 84, 86.

As shown in FIG. 1, each second and every subsequent selection unit of the first subgroup is connected at its second input E2 to the arithmetic/logic unit in the last of the sub-groups. For example, in the first group the output from the arithmetic/logic unit 38 is provided to the first selection device 23. The second input to the first selection device 23 is received from the arithmetic/logic unit 32. The third selection unit 24 located in the first sub-group receives its inputs from the arithmetic/logic unit 33 and the arithmetic/logic unit 39 located in the third sub-group.

Within the first group 12, the second inputs E2 of the first selection units 25, 28 of the remaining sub-groups are connected to the outputs of arithmetic/logic units 34, 37 respectively such that the first selection units 25, 28 each receives a single input. The second input E2 of the first selection units 26, 29 each receives the output of the second arithmetic/logic units 33, 36 respectively of the previous sub-group, et cetera until the last of the first selection units associated with a sub-group, and thus the last of the arithmetic/logic units associated with a previous sub-group has been reached. In this way, a horizontal and/or vertical logical interconnection of arithmetic/logic units within each one of groups, and/or a logical interconnection of arithmetic/logic units of a group to an upstream group may be implemented.

By appropriately configuring the multifarious connections and logical interconnections provided in the circuit 10 between the arithmetic/logic units of a group, and by configuring the logical interconnections between the groups, a flexible architecture is provided to implement various executable program instructions/algorithms. In this regard, it is possible to implement differently both the number of arithmetic/logic units arranged in a sub-group and their embodiment as multiply/accumulate units or dividers, as well as the specific number and sequence of these with the sub-groups, with the result that the given specified basic structure of the circuit 10 can be adapted to the given requirements of a certain group of functions and executable program instructions/algorithms to be implemented. At the same time, despite the high flexibility in configurability, the fundamental principle of prewired components is retained, while the desired efficiency in terms of surface area requirement of the circuit 10, low power consumption, and inexpensive fabrication of a corresponding circuit architecture, implemented, for example, as an integrated circuit, is maintained as desired.

In the embodiment described above based on FIG. 1, the first selection units 22-30, 42-50 and the second selection units 70-77 are designed, for example, as mask-programmable. Alternatively, the configuration of these first selection units and second selection units may be implemented through a control unit 200, as shown in FIG. 2.

Figure 2:
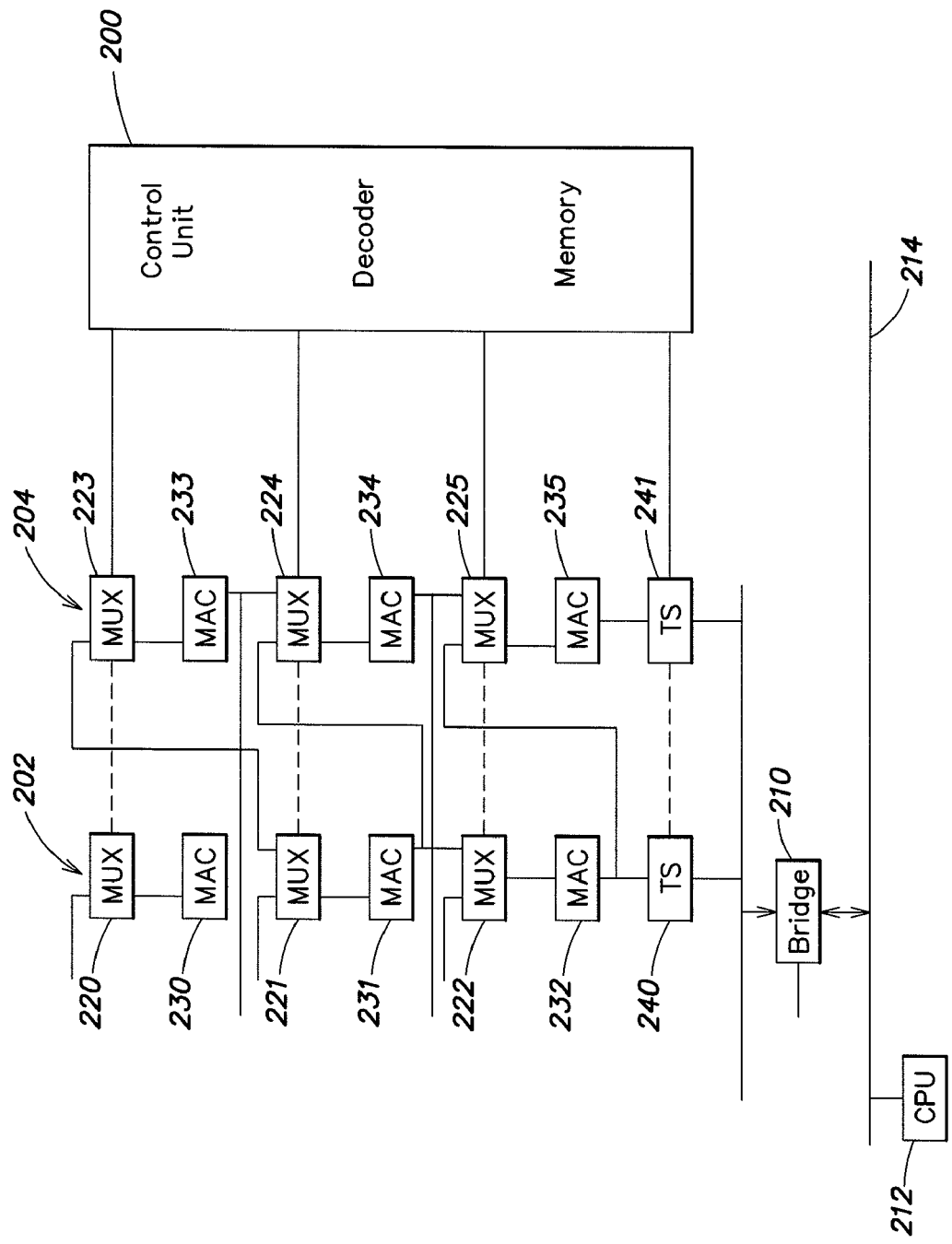
FIG. 2 is a block diagram illustration of the arrangement of arithmetic/logic units and selection units with a control unit.

FIG. 2 illustrates a segment of FIG. 1 with two sub-groups 202, 204 of a plurality of sub-groups, where the sub-groups 202, 204 comprise the first selection units and arithmetic/logic units known from FIG. 1, as well as second selection units associated with these sub-groups. In addition, FIG. 2 illustrates a switching device 210 and the connection of the microprocessor 212 through the switching device 210 to bus 214. An additional feature illustrated in FIG. 2 relative to the illustration shown in FIG. 1 is the control unit 200. The control unit 200 provides control lines to the first selection units 220-225, and to the second selection units 240-241. Depending on the number of the first selection units (e.g., 220-225) and the second selection units (e.g., 240, 241) a separate control unit may also be provided for each group. The control unit(s) may be located on-chip or off-chip.

Referring still to FIG. 2, the first and/or second selection units may be implemented such that they are controllable through decoders and memories. This enables the desired interconnection circuitry and logical interconnection of arithmetic/logic units (e.g., 230-235) to be configured according to requirements, within the sub-groups (e.g., vertical logical interconnections), within groups (e.g., horizontal logical interconnections), and extending over multiple groups, during the runtime of the given executable program instructions/algorithm to be executed. In another embodiment, the first selection units 220-225 and/or the second selection units 240, 241 may also be controllable through registers.

The microprocessor may be implemented for example as a CPU, a digital signal processor, or a state machine. The microprocessor illustrated in FIGS. 1 and 2 may be implemented as a module external to the circuit 10. This approach provides the above-referenced flexibility in terms of the embodiment of the microprocessor, for example, as a CPU, digital signal processor, or state machine, as a function of the required computing capacity as determined by the desired functions and algorithms to be implemented for the given application. Whereas the circuit 10 comprising the first selection units, second selection units, arithmetic/logic units, and switching units may be implemented as a flexible configuration in a relatively inexpensive-to-produce integrated circuit. Similarly, the microprocessor may also be integrated into the circuit 10, as shown in FIG. 3.

Figure 3:
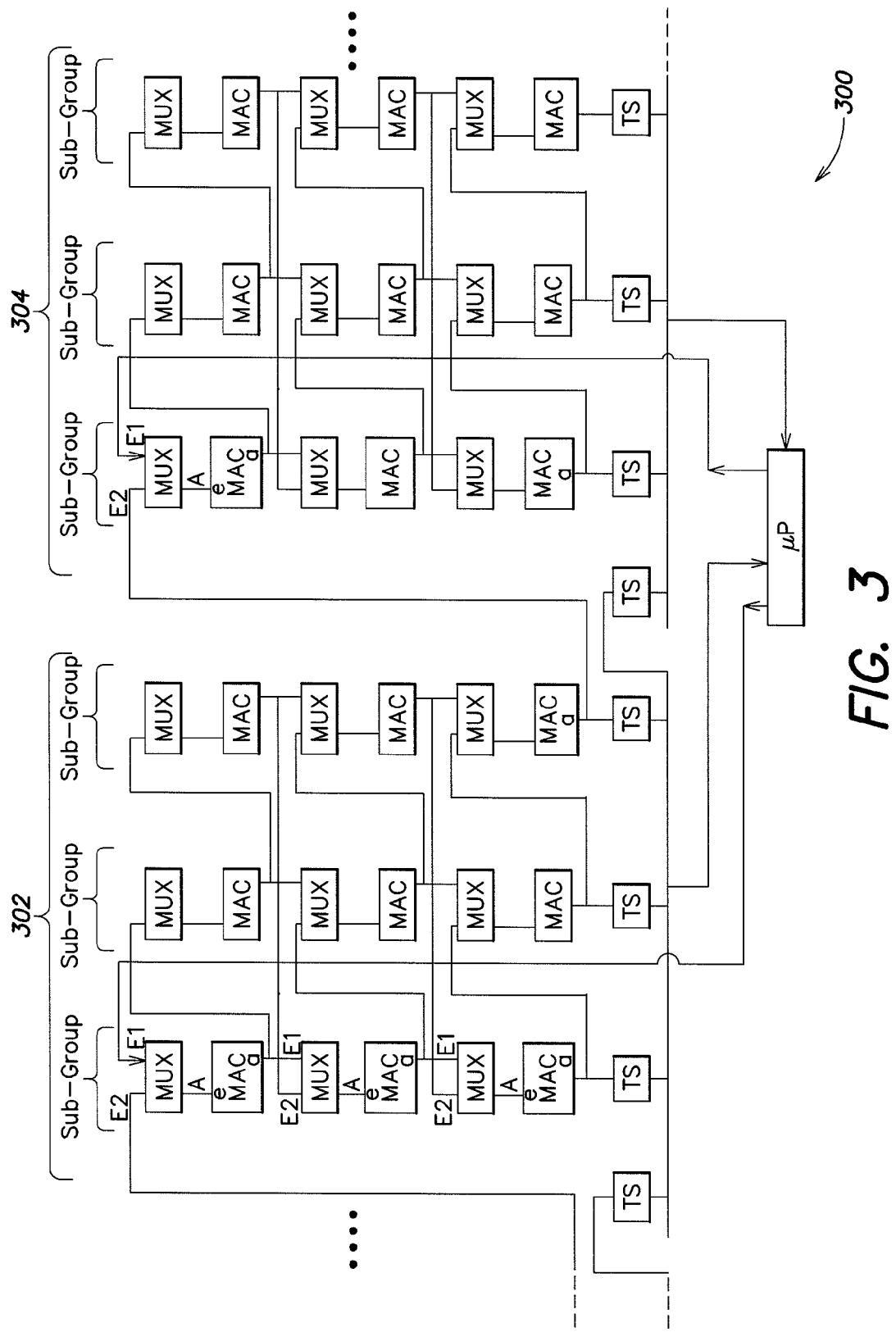
FIG. 3 is a block diagram illustration of the arrangement of arithmetic/logic units and selection units with an on-chip microprocessor.

FIG. 3 comprises the arrangement known from FIG. 1 of the first selection units, the second selection units, and arithmetic/logic units configured and arranged to form groups and sub-groups. As shown in FIG. 3 the microprocessor is a constituent of the circuit 300, implemented for example as an integrated circuit, and there is no need for switching devices (e.g., devices 84, 86 illustrated in FIG. 1) since the number of connection lines otherwise found leading externally from the circuit to connect the microprocessor does not play a role (in an externally disposed microprocessor as in FIG. 1, the number of required connection lines for the microprocessor, for example, on the package of a circuit architecture implemented as an integrated circuit, is divided in half by the switching units).

In the embodiment of FIG. 3, the microprocessor is connected directly with inputs E1 of the respective first one of the first selection units in the respective first sub-group to group 302, while at the same time the respective bus of each of the plurality of groups 302, 304 is similarly connected to the microprocessor integrated into the circuit architecture. As a result, the size of the overall arrangement of the circuit 300 can be further reduced as long as the embodiment of the microprocessor required for the specific function can be defined during the fabrication process of the circuit.

Embodiments of the circuit of the present invention provide the desired efficiency in terms of the required silicon surface area in an implementation as an integrated circuit, and also in terms of lower power consumption and of inexpensive fabrication. At the same time, the desirable high degree of flexibility in configurability is achieved. This flexibility is achieved, in particular, by the fact that the connections and logical interconnections provided in the circuit between the arithmetic/logic units of a group, and here in turn within individual units and/or between individual sub-groups, are freely configurable according to the specific requirements.

Both the number of the arithmetic/logic units arranged in a sub-group, as well as their embodiment as multiply/accumulate units or dividers, and the given number and sequence of these within the sub-groups of a group, can be implemented in various ways, with the result that the given specified basic structure of the circuit in other embodiments may be specifically adapted to the given requirements of a certain group of functions and algorithms to be implemented. In addition, any given number of the individual groups within a defined circuit may be logically interconnected so as to be able to execute simultaneously (e.g., in parallel) multiple algorithms of varying complexity and computational effort.

In the embodiments of the circuit according to the invention in which the configuration of the logical interconnection of the first and second selection units is effected either through decoders and memories, or through registers of a control unit, the definition of the logical interconnection of the arithmetic/logic units, of the sub-groups and groups, may also be effected dynamically during the runtime of the specific algorithms, and is not limited, for example, to one logical interconnection defined, for example by mask programming. The control unit here can in turn be implemented as an arrangement external to the circuit architecture, or, when implemented as an integrated circuit, be co-integrated into this circuit. The optional integration of the microprocessor into the circuit, for example as a microprocessor structure in an integrated circuit, allows for a reduction in the surface area requirement of the arrangement. Alternatively, the microprocessor may be implemented as an externally connectable arrangement, and thus adapted in terms of its embodiment to the specific function.

Although the present invention has been illustrated and described with respect to several preferred embodiments thereof, various changes, omissions and additions to the form and detail thereof, may be made therein, without departing from the spirit and scope of the invention.

What is claimed is:

1. An integrated circuit, comprising:
a plurality of circuit groups each comprising a plurality of circuit sub-groups, where each circuit sub-group comprises
a first selection unit that receives a first signal from an upstream arithmetic logic unit in addition to a second signal, and provides a first selected signal to a downstream arithmetic logic unit that provides a third signal to a second selection unit that also receives a fourth signal, where the second selection unit provides a second selected signal to a second downstream arithmetic logic unit, which provides a fifth signal to a buffer that provides a sixth signal;
a processor; and
a bus that receives the plurality of sixth signals from the plurality of circuit sub-groups and selectively routes a selected one of the sixth signals to the processor that is also connected to the bus,
where the first and second selection units are dynamically configured during run-time of an executable routine within the processor.

2. The integrated circuit of claim 1, where the processor comprises one of a CPU, a digital signal processor, or a state machine.

3. The integrated circuit of claim 1, where the first selection units comprise multiplexers.

4. The integrated circuit of claim 1, where the first selection units are controllable by mask programming.

5. The integrated circuit of claim 1, where the first selection units are controllable through decoders and memories.

6. The integrated circuit of claim 1, where the first selection units are controllable through registers.

7. The integrated circuit of claim 1, where the buffers comprise tristate buffers.

8. The integrated circuit of claim 1, where at least some of the arithmetic logic units comprise multiply/accumulate units.

9. The integrated circuit of claim 1, where at least some of the arithmetic logic units comprise dividers.

10. The integrated circuit of claim 1,
where at least one of the upstream arithmetic logic unit and the downstream arithmetic logic unit is configured as at least one of a multiply/accumulate unit and a divider.

11. An integrated circuit, comprising:
a processor;
a plurality of circuit groups, each circuit group comprising a plurality of circuit sub-groups and a bus, each circuit sub-group comprising
n circuit pairs, each circuit pair including a first selection unit and an arithmetic logic unit, which first selection unit provides a first output signal, and which arithmetic logic unit receives the first output signal and provides a second output signal, where the first selection unit in a first one of the circuit pairs receives at least one input signal, and where the first selection unit in a $n^{th}$ one of the circuit pairs receives the second output signal from the arithmetic logic unit in a $(n-1)^{th}$ one of the circuit pairs within a respective circuit sub-group and the second output signal from the arithmetic logic unit in the $(n-1)^{th}$ one of the circuit pairs within another one of the circuit sub-groups, and provides a second output signal; and
a second selection unit that receives the second output signal from the arithmetic logic unit in the $n^{th}$ one of the circuit pairs and provides a third output signal;
where the bus receives the third output signal from the second selection unit in each of the circuit sub-groups and selectively routes a selected one of the third output signals to the processor; and
where the bus in at least one of the circuit groups provides a fourth output signal to a third selection unit in communication with the bus in another one of the circuit groups.

* * * * *